United States Patent [19]
Liu et al.

[11] Patent Number: 5,701,020
[45] Date of Patent: Dec. 23, 1997

[54] PSEUDOMORPHIC STEP-DOPED-CHANNEL FIELD-EFFECT TRANSISTOR

[75] Inventors: Wen-Chau Liu; Lih-Wen Laih, both of Tainan, Taiwan

[73] Assignee: National Science Council, Taipei, Taiwan

[21] Appl. No.: 792,495

[22] Filed: Jan. 31, 1997

[51] Int. Cl.$^6$ .................................................. H01L 29/812

[52] U.S. Cl. ....................... 257/192; 257/280; 257/657

[58] Field of Search .......................... 257/192, 280, 257/655, 657

[56] References Cited

U.S. PATENT DOCUMENTS

| | | | |
|---|---|---|---|
| 4,980,731 | 12/1990 | Hida | 257/192 |
| 5,091,759 | 2/1992 | Shih et al. | 257/192 |
| 5,124,762 | 6/1992 | Childs et al. | 257/192 |
| 5,331,410 | 7/1994 | Kuwata | 257/192 |
| 5,408,111 | 4/1995 | Nakajima et al. | 257/192 |

OTHER PUBLICATIONS

Y. Chan, "Device Linearity Improvement by $Al_{0.3}Ga_{0.7}As/In_{0.2}Ga_{0.8}As$ Heterostructure Doped-Channel FET's," IEEE Elelctron Device Letters, vol. 16, No. 1, Jan. 1995, pp. 33–35.

Primary Examiner—Jerome Jackson
Assistant Examiner—John Guay
Attorney, Agent, or Firm—Townsend and Townsend and Crew LLP

[57] ABSTRACT

A pseudomorphic step-doped-channel field-effect transistor is provided, which has advantages of large transconductance, high electron mobility, high gate voltage swing and high current density, and can increase the pinch-off voltage tolerance. Thus the pseudomorphic step-doped-channel field-effect transistor is suitable for high-speed, high-power, and large-input signal circuitry systems. The pseudomorphic step-doped-channel field-effect transistor comprises: a semi-insulating GaAs substrate; an undoped GaAs layer formed on the GaAs substrate to serve as a buffer layer; an n-doping InGaAs layer formed on the undoped GaAs layer to serve as a channel layer; an undoped AlGaAs layer formed on the n-doping InGaAs layer to serve as a Schottky contact layer; an n-doping GaAs layer formed on the undoped AlGaAs layer; and metal layers formed on the undoped AlGaAs layer and the n-doping GaAs layer to respectively serve as a gate, a drain and a source of the pseudomorphic step-doped-channel field-effect transistor.

8 Claims, 3 Drawing Sheets

PSEUDOMORPHIC STEP-DOPED-CHANNEL FIELD-EFFECT TRANSISTOR

BACKGROUND OF THE INVENTION

1. Field of the Invention

The present application relates to a doped channel field-effect transistor (FET), and especially relates to a pseudomorphic step-doped-channel field-effect transistor.

2. Description of the Related Art

In recent years, technological development and research relating to heterostructure FET (HFET) of III–V group mostly concentrate on modulation-doped FET (MODFET) or high electron mobility transistor (HEMT). Although a MODFET has the advantages of large transconductance and high electron mobility, but it also suffers from the disadvantages of low current density, and small gate voltage swing. To overcome these disadvantages, a doped-channel FET (DCFET) has been developed in the prior art. But the current density and the gate voltage swing of the DCFET are not sufficient to meet the requirements, it still has a relatively low pinch-off voltage. Some relevant references are listed below: (1) Kastalakyand R. A. Kiehl, "On the low temperature degradation of (Al, Ga) As/GaAs modulation-doped field-effect transistors", IEEE Trans. Electron Device, 1986, 33, pp. 414–423 (2) Hong W. P. and Bhattacharya P. K., "High field transport in GaAs/InAlAs modulation-doped heterostructures", IEEE Trans. Electron Device, 1985, 34, pp. 1491–1495 (3) Hida H., Okamoto A., Toyoshima H., and Ohata K., "An investigation of i-AlGaAs/n-GaAs doped-channel MIS-like FET's", IEEE Trans. Electron Device, 1987, 34, pp. 1448–1455 (4) Liu W. C., Hsu W. C., Laih L. W., and Tsai J. H., "Performance enhancement in a metal-insulator-semiconductor-like pseudomorphic transistor by utilizing an n⁻-GaAs/n-In$_{0.2}$Ga$_{0.8}$As two-layer structure", Appl. Phys. Lett., 1995, 66, pp. 1524–1526 (5) Shieh H. M., Hsu W. C., Hsu W. C., and Wu Y. S., "A high-performance δ-doped GaAs/In$_x$Ga$_{1-x}$As pseudomorphic high electron mobility transistor utilizing a graded In$_x$Ga$_{1-x}$As channel", IEEE Electron Device Lett. 1993, 14, pp. 581–583.

SUMMARY OF THE INVENTION

In order to overcome these disadvantages of the prior arts, the object of the present invention is to provide a pseudomorphic step-doped-channel field-effect transistor, which has the advantages of large transconductance, high electron mobility, high gate voltage swing, and high current density, and can be used to increase the pinch-off voltage tolerance. So the pseudomorphic step-doped-channel field-effect transistor is suitable for high-speed, high-power, and large-input signal circuitry systems.

In order to achieve this object, a pseudomorphic step-doped-channel field-effect transistor of the present invention is provided, which comprises: a semi-insulating GaAs substrate; an undoped GaAs layer formed on the GaAs substrate to serve as a buffer layer; an n-doping InGaAs layer formed on the undoped GaAs layer to serve as a channel layer; an undoped AlGaAs layer formed on the n-doping InGaAs layer to serve as a Schottky contact layer; an n-doping GaAs layer formed on the undoped AlGaAs layer; and metal layers formed on the undoped AlGaAs layer, and the n-doping GaAs layer to serve as a gate, a drain, and a source, respectively. Wherein in the n-doping InGaAs layer, the mole ratio of In and Ga is maintained, but the doping concentration is changed step by step to form a step-doped-channel FET.

DESCRIPTION OF THE DRAWINGS

The following detailed description, given by way of example and not intended to limit the invention solely to the embodiments described herein, will best be understood in conjunction with the accompanying drawings in which.

DESCRIPTION OF THE PREFERRED EMBODIMENT

Figure 1:
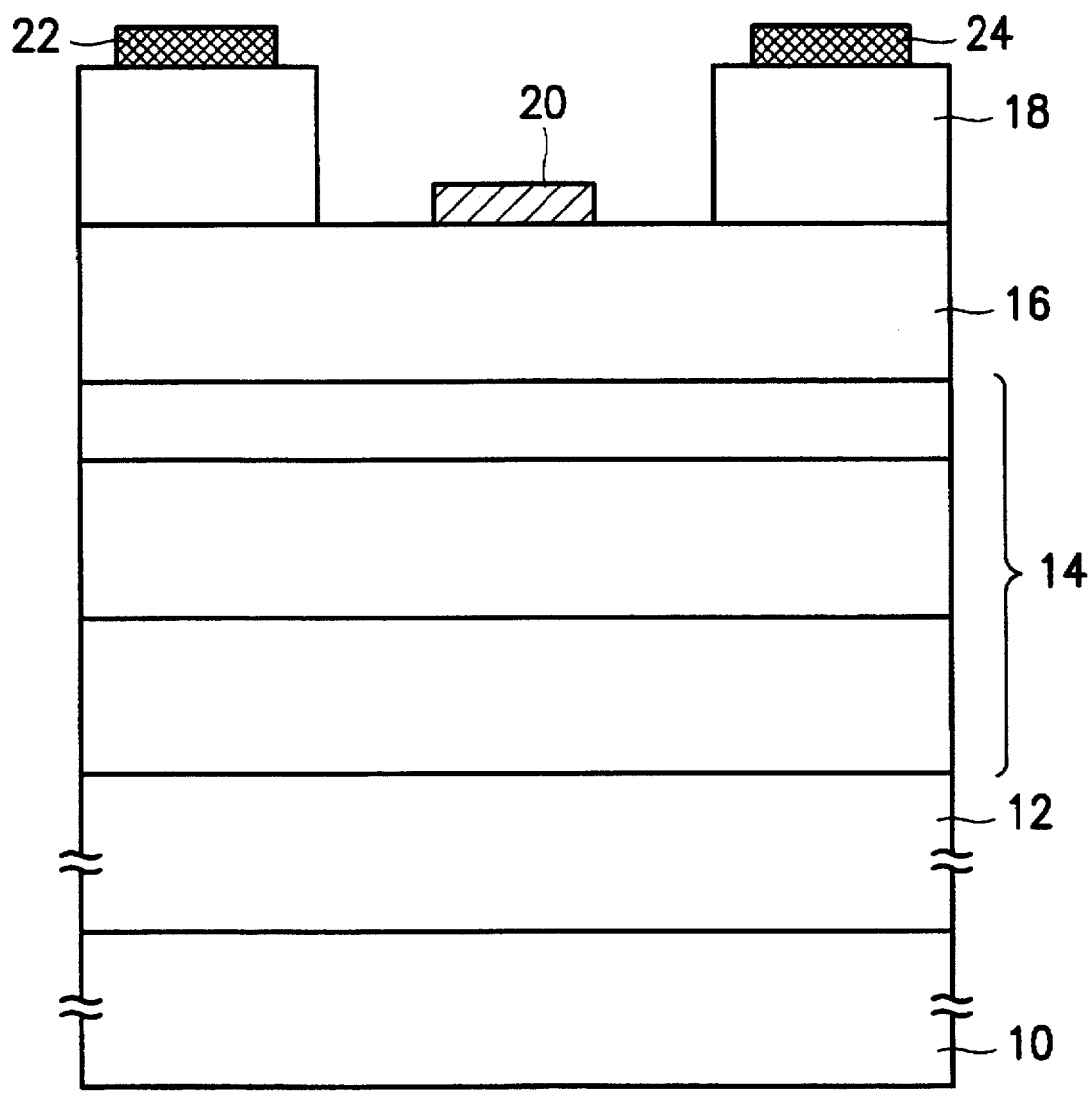
FIG. 1 shows the configuration of the pseudomorphic step-doped-channel field-effect transistor of the present invention.

Now referring to FIG. 1, the configuration of the pseudomorphic step-doped-channel field-effect transistor comprises: a semi-insulating GaAs substrate 10; an undoped GaAs layer 12 formed on the GaAs substrate 10 to serve as a buffer layer; an n-doping InGaAs layer 14 formed on the undoped GaAs layer 12 to serve as a channel layer; an undoped AlGaAs layer 16 formed on the n-doping InGaAs layer 14 to serve as a Schottky contact layer; an n-doping GaAs layer 18 formed on the undoped AlGaAs layer 16; and metal layers respectively formed on the undoped AlGaAs layer 16, and the n-doping GaAs layer 18 to respectively serve as a gate 20, a drain 22, and a source 24.

Wherein the thickness of the undoped GaAs layer 12 is about 0.5 μm. In the InGaAs layer 14, the mole ratio of In and Ga is 15:85, and the thickness and doping concentration from the upper layer to the lower layer are 50 Å, 4×10$^{18}$ cm$^{-3}$; 100 Å, 1×10$^{18}$ cm$^{-3}$; and 100 Å, 5×10$^{17}$ cm$^{-3}$, respectively. The undoped AlGaAs layer 16 has a thickness of 300 Å, wherein the mole ratio of Al and Ga is 30:70. The n-doping GaAs layer 18 has a thickness of 300 Å, and a doping concentration of 4×10$^{18}$ cm$^{-3}$. The metal layer formed on the undoped AlGaAs layer 16 to serve as a gate includes Al, which forms a Schottky contact with the undoped AlGaAs layer 16. The metal layer formed on the n-doping GaAs layer 18 is Au/Ge/Ni alloy, which serves as a drain and a source. The Au/Ge/Ni alloy forms an ohmic contact with the GaAs layer 18.

Figure 2:
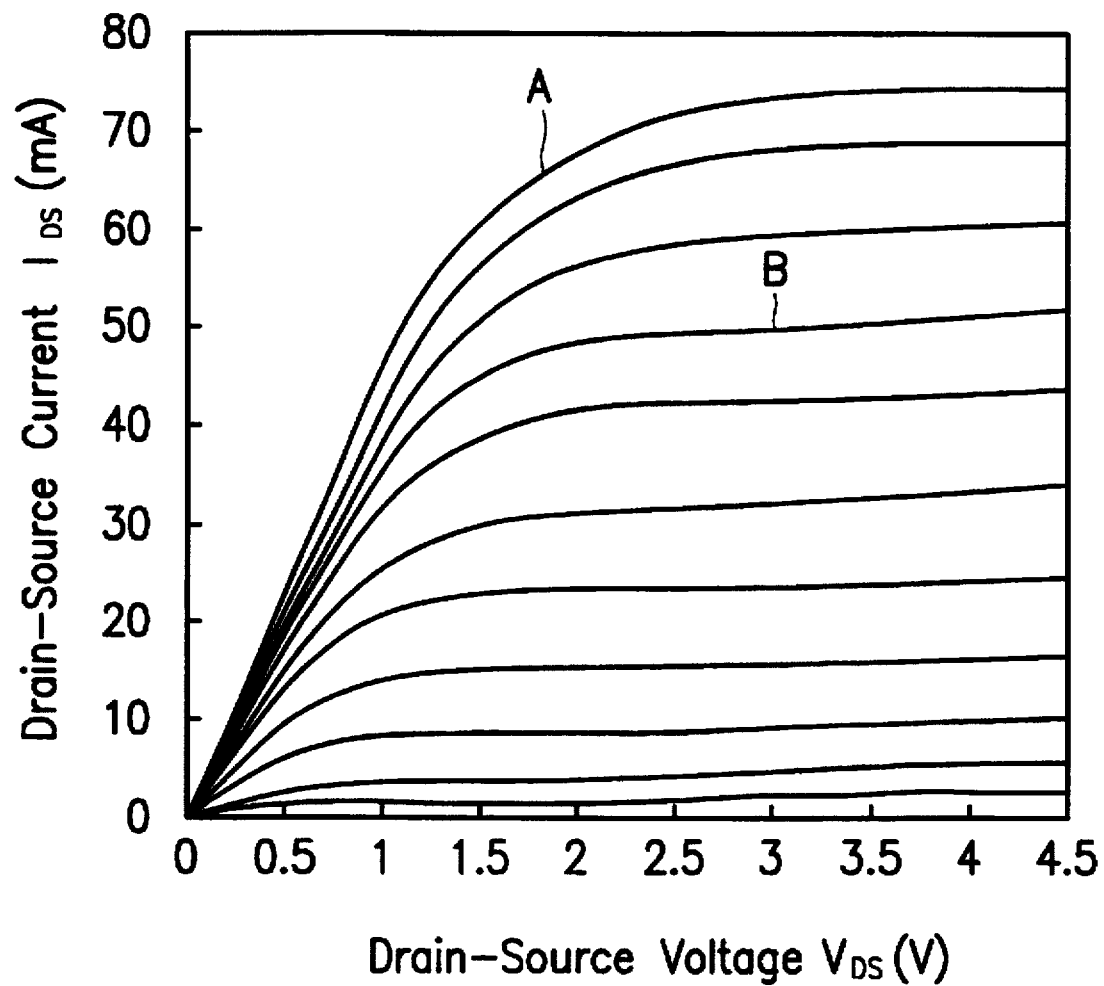
FIG. 2 shows the drain-source current vs. the drain-source voltage in the pseudomorphic step-doped-channel field-effect transistor of the present invention.

In accordance with the pseudomorphic step-doped-channel field-effect transistor of the present invention, the relationship between drain-source voltage and drain-source current is shown in FIG. 2. In FIG. 2, each curve represents a different gate-source voltage V$_{GS}$, and the V$_{GS}$ decreases by a step of 0.5 V. The curve A represents the condition of V$_{GS}$ equal to 1.5 V, and the curve B represents the condition of V$_{GS}$ equal to 0 V. The largest gate voltage is 1.5 V, and the threshold voltage is about of −3.7 V. The reason for such a small threshold voltage is that most electrons in the channel are accumulated near the gate side. Therefore, in order to deplete the channel completely, a larger negative threshold voltage must be applied.

Figure 3:
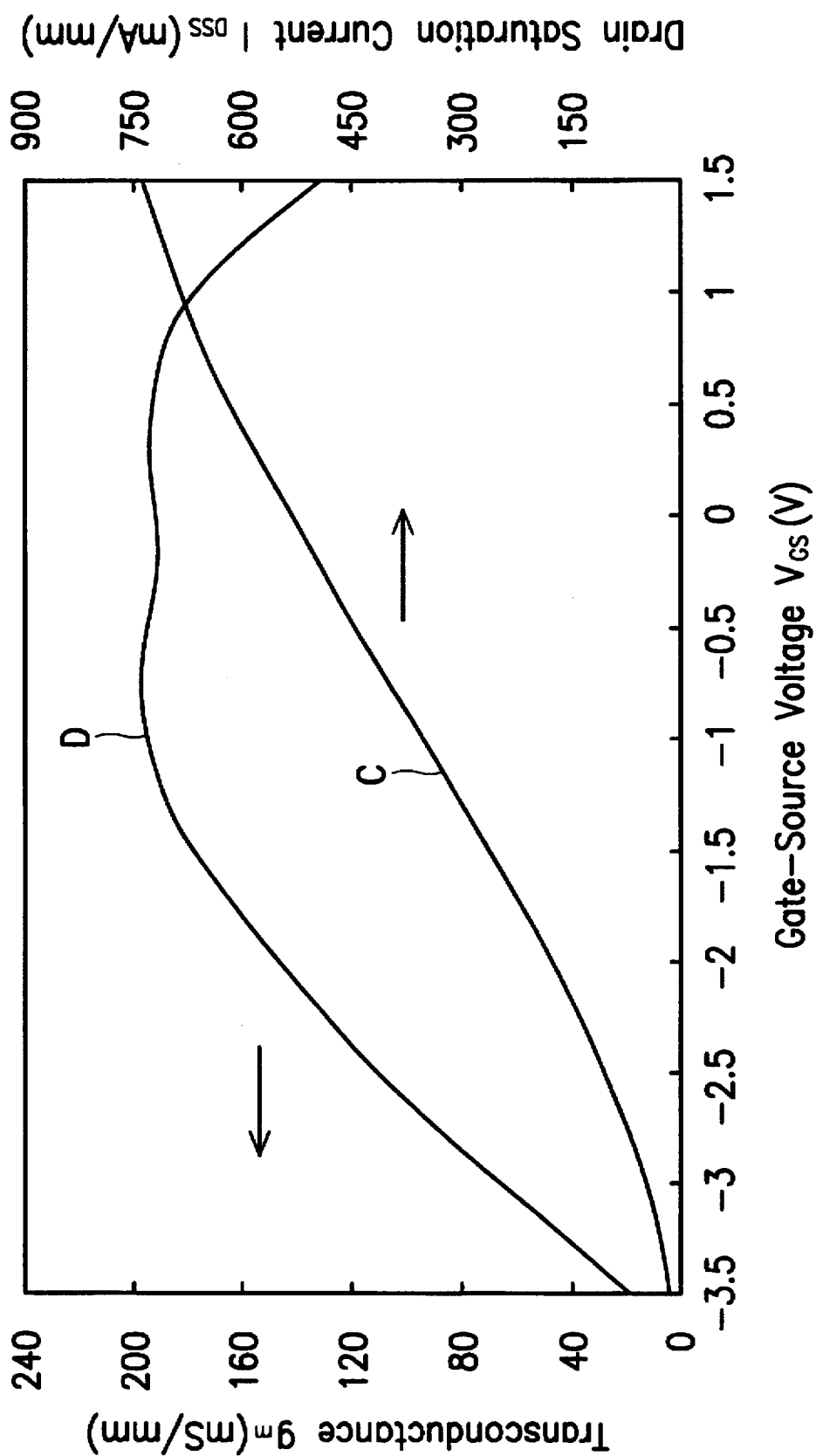
FIG. 3 shows the drain saturation current along with the transconductance vs. the gate voltage of the present invention, when the drain-source voltage V$_{DS}$ is 4 V.

Now referring to FIG. 3, which illustrates the relation of the drain saturation current and the transconductance against the gate voltage of the present invention when the V$_{DS}$ is 4 V, the curve C represents the drain saturation current, and the curve D represents the transconductance. It is obvious that the largest drain saturation (I$_{DSS}$), and the transconductance can respectively reach 735 mA/mm, and 200 mS/mm. Besides, the drain saturation current has good current linearity. The pseudomorphic step-doped-channel field-effect transistor of the present invention has a gate breakdown voltage of 15 V.

It is known that the present invention is characterized by large drain saturation current, high gate breakdown voltage, high transconductance, and broader gate voltage swing, because the device of the present invention applies a step-doped-channel. Furthermore, the pseudomorphic step-doped-channel field-effect transistor of the present invention is very useful in high speed and high power circuitry.

What is claimed is:

1. A pseudomorphic step-doped-channel field-effect transistor, comprising:

a semi-insulating GaAs substrate;

an undoped GaAs layer formed on said GaAs substrate to serve as a buffer layer;

an n-doping InGaAs layer formed in said undoped GaAs layer to serve as a channel layer, wherein the doping concentration increases step by step from the interface of said n-doping InGaAs layer and said undoped GaAs layer;

an undoped AlGaAs layer formed on said n-doping InGaAs layer;

an n-doping GaAs layer formed on said undoped AlGaAs layer; and metal layers respectively formed on said undoped AlGaAs layer and said n-doping GaAs layer to serve as a gate, a drain and a source of said pseudomorphic step-doped-channel field-effect transistor, respectively.

2. The FET of claim 1, wherein said undoped GaAs layer has a thickness of 0.5 μm.

3. The FET of claim 1, wherein the mole ratio of In and Ga is 15:85.

4. The FET of claim 1, wherein the respective stepped doping thickness and the doping concentration from upper layer to lower layer are 50 Å, $4\times10^{18}$ cm$^{-3}$; 100 Å, $1\times10^{18}$ cm$^{-3}$, 100 Å, $5\times10^{17}$ cm$^{-3}$ in said n-doping InGaAS layer.

5. The FET of claim 1, wherein the undoped AlGaAs layer has a depth of 300 Å, and the mole ratio of Al and Ga is 30:70.

6. The FET of claim 1, wherein the thickness and the doping concentration are 300Å and $4\times10^{18}$ cm$^{-3}$ in said n-doping GaAs layer.

7. The FET of claim 1, wherein the metal layer formed on said undoped AlGaAs layer is Al.

8. The FET of claim 1, wherein the metal layer formed on said n-doping AlGaAs layer is Au/Ge/Ni alloy.

* * * * *